(12) United States Patent
Li et al.

(10) Patent No.: US 7,473,378 B2
(45) Date of Patent: Jan. 6, 2009

(54) METHOD AND APPARATUS PROVIDING GRADED-INDEX MICROLENSES

(75) Inventors: Jin Li, Boise, ID (US); Jiutao Li, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 11/501,055

(22) Filed: Aug. 9, 2006

(65) Prior Publication Data

US 2007/0035849 A1 Feb. 15, 2007

Related U.S. Application Data

(62) Division of application No. 11/201,292, filed on Aug. 11, 2005.

(51) Int. Cl.
*B29D 11/00* (2006.01)

(52) U.S. Cl. .......................... 216/26; 216/24

(58) Field of Classification Search ............. 216/24, 216/26; 21/26
See application file for complete search history.

(56) References Cited

U.S. PATENT DOCUMENTS

| | | |
|---|---|---|
| 2,216,965 A | 10/1940 | Sukumlyn |
| 2,849,713 A | 8/1958 | Robinson, Jr. |
| 3,447,860 A | 6/1969 | Lucas |
| 3,823,995 A | 7/1974 | Carpenter |
| 4,848,881 A | 7/1989 | Kahan et al. |
| 4,956,000 A | 9/1990 | Reeber et al. |
| 5,102,694 A | 4/1992 | Taylor et al. |
| 5,262,896 A | 11/1993 | Blankenbecler |
| 5,629,800 A | 5/1997 | Hamblen |
| 5,711,890 A | 1/1998 | Hawkins et al. |
| 5,734,190 A | 3/1998 | Hawkins et al. |
| 5,824,236 A | 10/1998 | Hawkins et al. |
| 6,211,916 B1 | 4/2001 | Hawkins et al. |
| 6,661,581 B1 | 12/2003 | Sankur |
| 6,821,810 B1 | 11/2004 | Hsiao et al. |
| 6,833,601 B2 * | 12/2004 | Murakami .................. 257/437 |
| 6,903,395 B2 | 6/2005 | Nakai et al. |
| 6,953,925 B2 | 10/2005 | Fang et al. |

(Continued)

OTHER PUBLICATIONS

Kohler, Michael; "Etching in Microsystem Technology" p. 318. Wiley VCH, 1999.*
US 5,572,519, 09/1997, Song et al. (withdrawn)

*Primary Examiner*—Roberts Culbert
(74) *Attorney, Agent, or Firm*—Dickstein Shapiro LLP

(57) ABSTRACT

Microlenses are fabricated with a refractive-index gradient. The refractive-index gradient is produced in a microlens material such that the refractive index is relatively higher in the material nearest the substrate, and becomes progressively lower as the layer gets thicker. After formation of the layer with the refractive-index gradient, material is etched from the layer through a resist to form microlenses. The index of refraction can be adjusted in the microlens material by controlling oxygen and nitrogen content of the microlens materials during deposition. High-oxide material has a lower index of refraction. High-oxide material also exhibits a faster etch-rate. The etching forms the material into a lens shape. After removal of the resist, the microlenses have a lower relative refractive index at their apex, where the index of refraction preferably approaches that of the ambient surroundings. Consequently, light loss by reflection at the ambient/microlens interface is reduced.

9 Claims, 7 Drawing Sheets

U.S. PATENT DOCUMENTS

| | | |
|---|---|---|
| 7,002,754 B2 | 2/2006 | Baer et al. |
| 7,097,778 B2 | 8/2006 | Ho et al. |
| 7,119,319 B2 | 10/2006 | Noto et al. |
| 2004/0232105 A1 | 11/2004 | Kaise et al. |
| 2005/0103745 A1 | 5/2005 | Li |
| 2005/0133478 A1* | 6/2005 | Kim et al. .................... 216/26 |
| 2007/0035849 A1 | 2/2007 | Li et al. |
| 2007/0148805 A1 | 6/2007 | Kim |

* cited by examiner

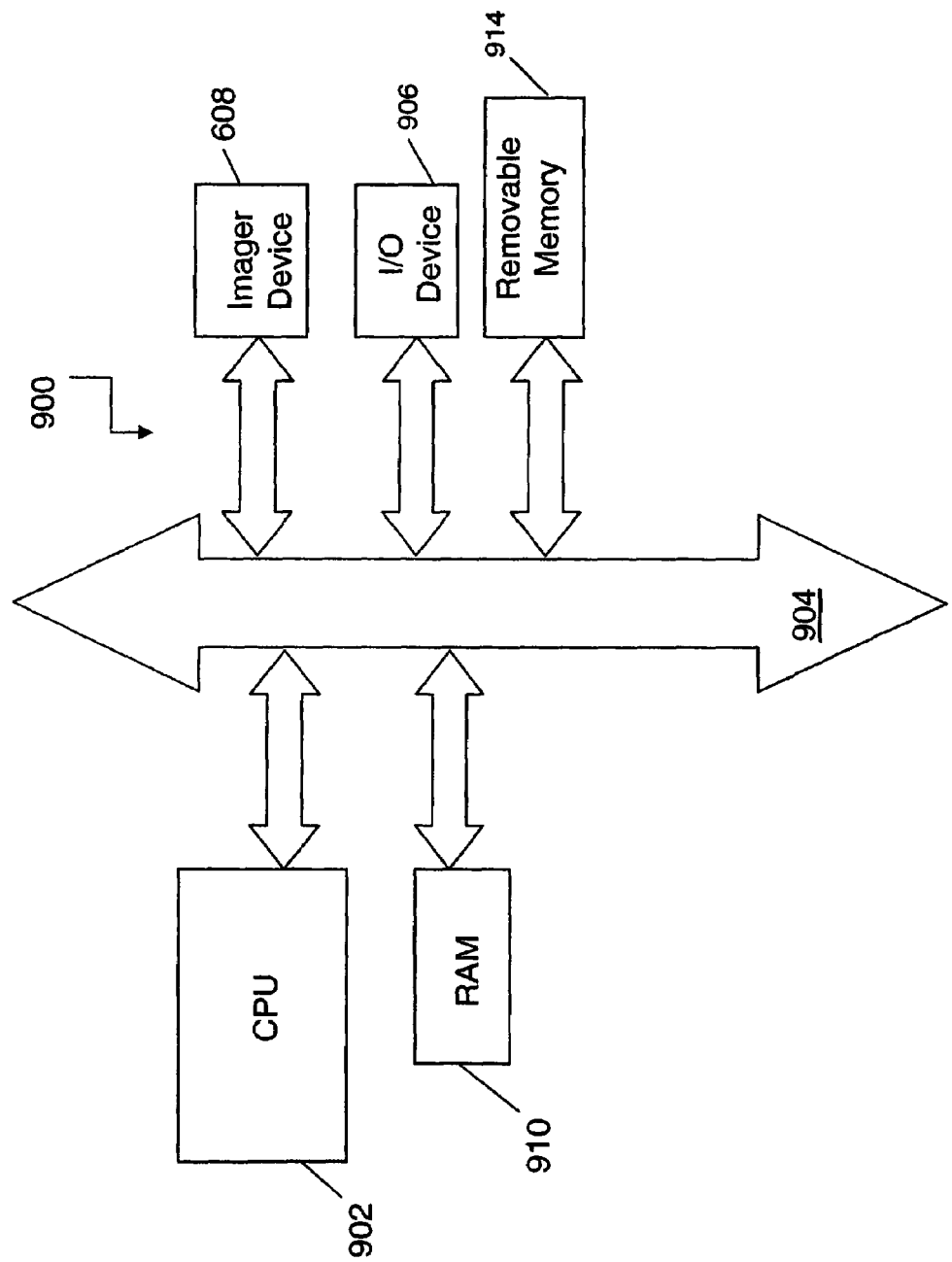

METHOD AND APPARATUS PROVIDING GRADED-INDEX MICROLENSES

CROSS REFERENCE TO RELATED APPLICATIONS

The present application is a divisional of U.S. patent application Ser. No. 11/201,292, filed on Aug. 11, 2005, the disclosure of which is incorporated by reference in its entirety.

FIELD OF THE INVENTION

This invention generally relates to microlenses and in particular to microlenses having reduced reflection at an interface with an ambient environment.

BACKGROUND OF THE INVENTION

Microlenses are used to focus light of a larger area onto a photodiode of a solid-state imager pixel, for example. Microlenses also can be used to trap light into solar cells. Also, light from a light-producing component can be transmitted through microlenses, for example, to project an image for display. Advanced products and systems that utilize microlenses in these and other similar ways include, without limitation, digital cameras, flat-panel visual displays, and solar panels. Such products and systems are used in a wide variety of practical applications.

The direction that light is propagated through two media, such as air and a lens, is based on the relationship between the refractive indices of the media. Snell's Law (Eq. 1) relates the indices of refraction n of the two media to the directions of propagation in terms of angles to the normal:

$$\frac{n_1}{n_2} = \frac{\sin\theta_1}{\sin\theta_2} \quad (1)$$

The index of refraction (n) is defined as the speed of light in vacuum (c) divided by the speed of light in the medium (v), as represented by Eq. 2:

$$n = \frac{c}{v} \quad (2)$$

The refractive index of a vacuum is 1.000. The refractive index of air is 1.000277. Representative materials used in microlens and semiconductor device fabrication include oxides, such as silicon dioxide ($SiO_2$) with a refractive index of 1.45, and nitrides, such as silicon nitride ($Si_3N_4$) with a refractive index of 2.0.

When light travels from a medium with a low refractive index, such as air, to a medium with a high refractive index (the incident medium), such as silicon nitride, the angle of light with respect to the normal will increase. In addition, some light will be reflected. This will reduce the efficiency the imaging system, since not all of the light hitting the lens will travel through the lens to the photodiode, for example.

Light reflection that would occur at the interface between two media can be reduced if the two media have similar indices of refraction. U.S. Pat. No. 6,833,601 to Murakami teaches semiconductor imaging devices in which a refractive-index matching layer is provided over photodiodes of a solid-state imaging device. The refractive-index matching layer formed of mixed insulating-material compounds having a combined composition represented as $SiO_xN_y$. The oxygen and nitrogen contents of the layer are varied by regulating a mixture of insulating-materials during deposition. The mixture is regulated to have the lowest-oxygen/highest-nitrogen combined-content in the initial deposit, adjacent the photodiode-containing layer. The refractive index of this initially-deposited layer is similar to that of the photodiode-containing layer. As deposition continues, the mixture is adjusted to progressively-increase combined-oxygen content, and decrease combined-nitrogen content. Material having the highest-oxygen/lowest-nitrogen combined-content is deposited last, near the top of the refractive-index matching layer. As a result, reflectance at an interface between the photodiode and the refractive-index matching layer is reduced.

A microlens with reduced reflection of incident light would capture and transmit more light to the photosensor of a solid-state imager, for example. The increased light captured would include light that previously would have been reflected. Likewise, if the microlens were used in a display, reduced-reflection of the display light would produce a brighter display image.

BRIEF SUMMARY OF THE INVENTION

The present invention in various exemplary embodiments provides a microlens, and associated fabricating methods, with an internal structure having a refractive-index gradient. The refractive-index gradient minimizes reflection of light incident at the interface of the microlens and improves a light-receiving or light-transmitting efficiency.

The exemplary microlens can be formed on a supporting substrate by depositing a film-stack made from combined-compound materials. Each of the compound materials has a different index of refraction. The mixture of the compounds is varied under control during deposition to progressively produce a refractive-index gradient in the film-stack. The resulting film-stack is formed into microlenses, as described further below. Different refractive-indices are featured at different depths of the microlens. The refractive index of the combined-compound material at the microlens-ambient and microlens/substrate interfaces preferably is close to ambient or adjacent structures to which light from the microlens is passed.

Initial film-stack deposits can use a high refractive-index material, such as silicon nitride. The refractive index of the initial film-stack deposits closely matches the refractive index of the supporting substrate. The final, uppermost deposit can use a low refractive-index material, such as silicon oxide. The lowest index of refraction can approach that of the ambient surroundings, which typically is air. The index of refraction for air 1. Silicon oxide has a similar refractive index. If additional deposits are made between the first and final deposits, the refractive indices of the compounds used will vary progressively from that of silicon nitride to that of silicon oxide. The gradient can be continuous or stepped.

As an alternative to a stacked layered structure, a single layer of material may be formed such that during the fabrication of the layer the ratio of oxygen to nitrogen is changed providing a refractive index gradient.

The deposited materials combined to make the exemplary microlenses can be represented by $SiO_xN_y$, where x and y are non-negative numbers and are inversely related. Refractive indices of the deposited materials can be adjusted during deposition by regulating the amounts of oxygen-containing and nitrogen-containing materials in the gaseous mix of a chemical vapor deposition apparatus. Material having a higher oxygen/lower nitrogen content exhibits a relatively-lower index of refraction. Material having a higher nitrogen/lower oxygen content will exhibit a relatively-higher index of refraction. The oxygen/nitrogen contents of the materials can be regulated discretely to provide a laminate-microlens construct having a stepped gradient. The oxygen/nitrogen content also can be regulated continuously during fabrication to provide a smooth gradient.

The exemplary microlenses can be provided in an array matrix disposed over a corresponding array of solid-state photo-active devices. The photo-active devices can include photocollectors such as those used conventionally in semiconductor imagers. The photo-active devices also can include light-generators, such as light-emitting diodes (LEDs), as are conventionally used in displays and projectors.

BRIEF DESCRIPTION OF THE DRAWINGS

FIG. 11 is an illustration of a computer system including a CMOS imager according to an exemplary embodiment of the present invention.

DETAILED DESCRIPTION OF THE INVENTION

In the following detailed description, reference is made to the accompanying drawings which form a part hereof and illustrate specific exemplary embodiments by which the invention may be practiced. It should be understood that like reference-numerals represent like-elements throughout the drawings. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in or over the base semiconductor structure or foundation. In addition, the semiconductor need not be silicon-based, but could be based on silicon-germanium, germanium, or gallium arsenide, for example.

Figure 1:
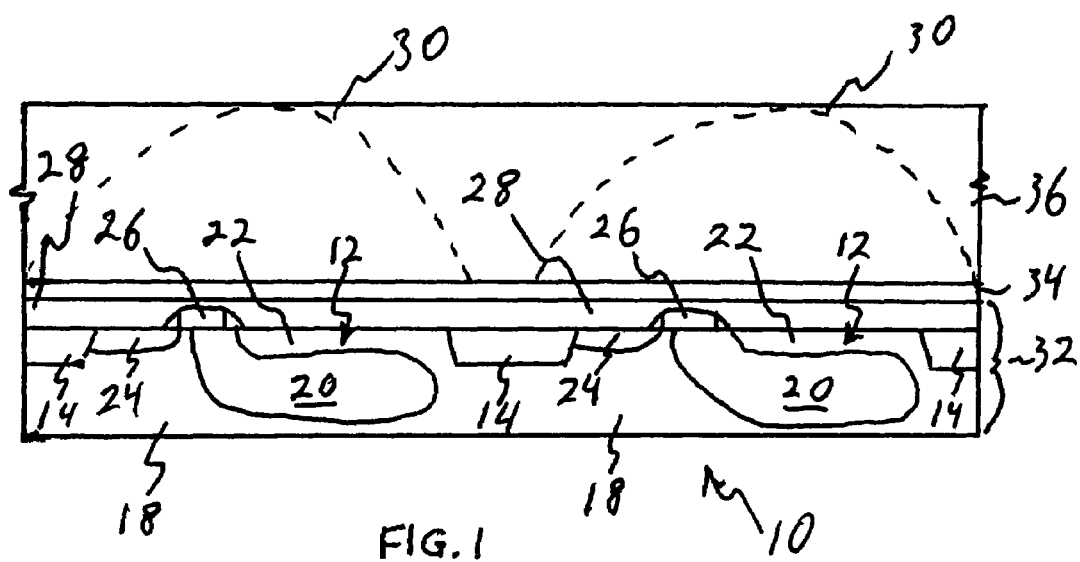
FIG. 1 is a cross-sectional view showing a first step in the fabrication of microlenses having a refractive-index gradient according to an exemplary embodiment of the present invention.

The invention can be used in conjunction with various light-management applications including, for example, imagers employing photosensors, and display devices utilizing light-emitters. For convenience, however, and without limitation, the invention is described in the context of an imager. A portion of a CMOS imager 10 in the initial stages of microlens-fabrication is shown in FIG. 1 in cross-section. FIG. 1 illustrates in simplified form two representative cells from a matrix array of photosensing-cells that substantially completed except for a corresponding microlens matrix array.

Each photosensing cell includes a photodiode 11 separated by trench-isolation regions 14 formed in a p-type substrate 18. Each photodiode 11 is constituted in part by an n-type charge-collection region 20 and a p-type region 22. Floating diffusion region 24 is linked to the n-type charge-collection region by a gate 26 of a source-follower transistor. A transparent insulating layer 28 is formed over the gates and other photosensor components to form a component layer 32. An etch-stop layer 34 is supplied over component layer 32. The fabrication of microlenses from the film-stack 36 is described below. The locations 30 where the microlenses will be formed is shown by dashed lines in FIG. 1.

Figure 2:
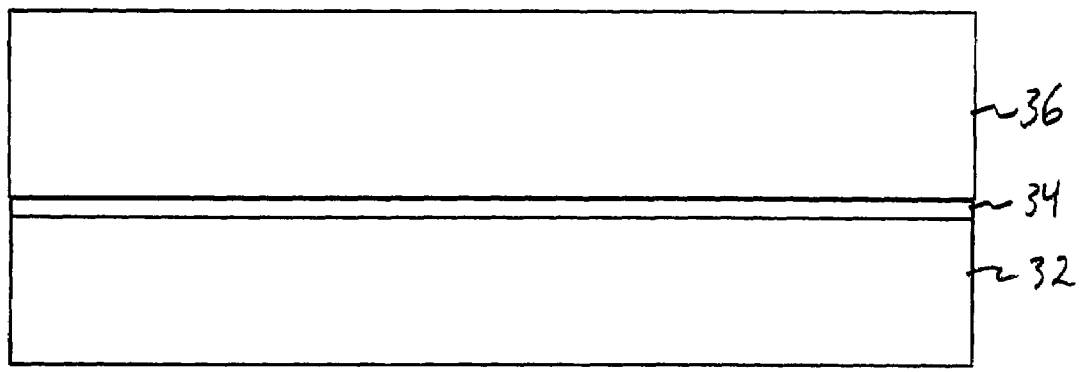
FIG. 2 illustrates a further step in the fabrication of microlenses by forming a film-stack having a refractive-index gradient according to the exemplary embodiment of the present invention.
Figure 4:
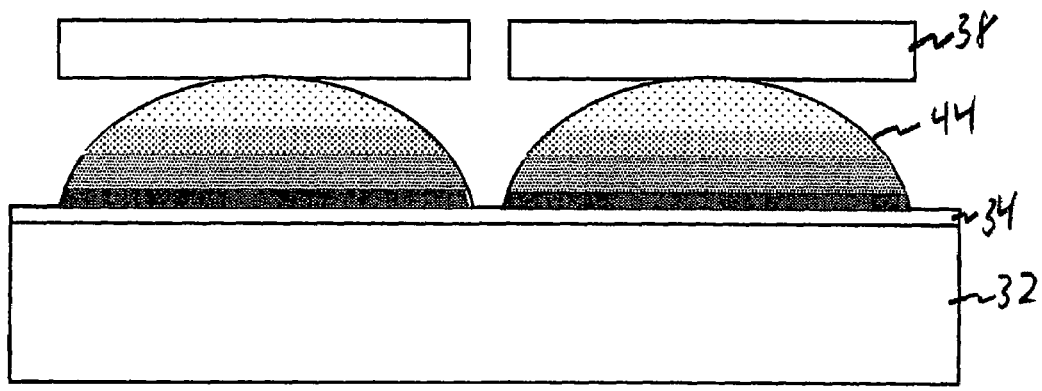
FIG. 4 illustrates fabrication steps subsequent to those shown in FIGS. 2 and 3, including patterning a resist and etching to form microlenses having a refractive-index gradient according to the exemplary embodiment of the present invention.
Figure 5:
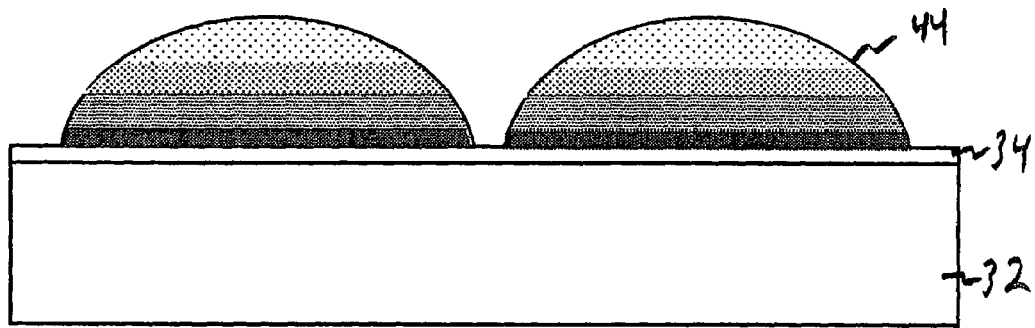
FIG. 5 illustrates completed microlenses having a refractive-index gradient according to the exemplary embodiment of the present invention.

Those of ordinary skill in the art will understand that additional imager components are not shown in FIG. 1. Imagers also can include additional transistors and gate structures, metal interconnect layers, color-filter arrays, etc. These and other details are not shown for the sake of clarity. FIGS. 2, 4, 5 include the component layer 32 shown generically, without including any component-details, for additional simplicity and clarity of illustration. In similar fashion, component layers 50, 60, 70, 80 are shown generically in FIGS. 6A, 6B; 7A;7B; 8A, 8B; 9A, 9B respectively. It is understood that the component layers 32, 50, 60, 70, 80 include solid-state and other imager components, and that the invention is not limited to photosensors, nor to a particular photosensor arrangement. Additional details on specific layers of an imager between the photosensors and fabricated membranes are shown in representative U.S. Pat. Nos. 6,844,580, 6,784,013, which are incorporated herein by reference.

Microlens-fabrication according to an exemplary embodiment of the present invention proceeds with formation of a graded-index film-stack 36. Film-stack 36 is illustrated generically in FIG. 1. Referring to FIG. 2, the graded-index film-stack 36 includes several layers of a mixture of insulating material deposited by low-pressure chemical vapor deposition (CVD). According to an exemplary embodiment of the present invention plasma-enhanced CVD (PECVD) is utilized.

Fabrication of the graded-index film-stack 36 is performed using a mixture of inorganic microlens materials. At least one of the microlens materials is a compound that includes oxygen, such as $SiO_2$. Another microlens materials is a compound that includes nitrogen, such as $Si_3N_4$. The amounts of the oxygen and nitrogen compounds being mixed are regulated during deposition to produce the desired gradient. The elemental content of the mixed-compound graded-index film-stack can be represented as $SiO_xN_y$.

By adjusting the oxygen and nitrogen content of the deposited material during deposition, various properties of the deposited material in the film-stack can be controlled. For example, as the amount of oxygen in the microlens material increases, the refractive index of the material decreases. In addition, as the oxygen content increases, the etch-rate of the material increases. Concomitantly, as the nitrogen content increases, the refractive index increases, and the etch rate decreases. The refractive-index and etch-rate profile of the microlens is controlled by regulating the amount of $SiO_2$ and $Si_3N_4$ in the deposited microlens material.

According to an exemplary embodiment, material first-deposited on the substrate 42, represented as $SiO_xN_y$, can have an oxygen content as low as x=0. The amounts of oxide and nitride are controlled to increase the oxygen content of the deposited material. Material in the last-deposited portions 40 of the graded-index layer 36 can have a nitrogen content as low as 0. Between layers 40 and 42 are several layers having progressively higher oxygen content as deposition proceeds from the first-deposited material to the last-deposited material. In the illustration of FIG. 2, the low-oxide (high-nitride) material is shown with darker shading; the high-oxide (low-nitride) material is shown with lighter shading.

The deposition process is exemplified by plasma enhanced chemical vapor deposition (PECVD) techniques in which gaseous reactors are used to form solid layers on a substrate surface. Deposition is enhanced by the use of a vapor containing electrically charged particles or plasma, at lower temperatures. The compositions and amounts of the materials being deposited can be adjusted in the gaseous reactors to regulate the types and properties of the materials being deposited.

Figure 3:
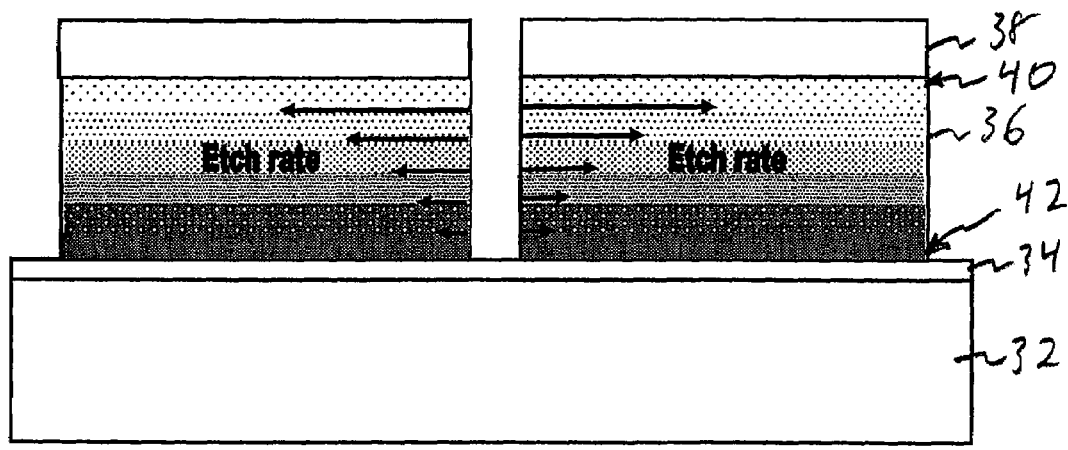
FIG. 3 diagrams a relationship between the oxygen and nitrogen contents of the film-stack having a refractive-index gradient illustrated in FIG. 2.

FIG. 3 diagrams an example of the relationship between the oxygen and nitrogen contents of the film-stack 36 represented by $SiO_xN_y$. In FIG. 3A, the oxygen ($O_2$) and nitrogen ($N_2$) contents (%) are shown on the ordinate, and the deposition position in the deposition direction, refractive index, and etch-rate of the film-stack 36 are shown on the abscissa. Raw material gases such as $SiH_4$, $NH_3$, $O_2$, and the like can be used.

The film-stack 36 is deposited by using PECVD or other low-pressure CVD apparatus. During deposition an oxygen gas flow rate can be controlled as an increasing function. At the same time, a nitrogen ($NH_3$) gas flow rate can controlled as a decreasing function. In this way, in the film-stack represented by $SiO_xN_y$, x increases from the initial deposit to the last deposit, and y decreases respectively.

Therefore, in the film-stack 36, the refractive index can be varied from the refractive index of a silicon oxide film (1.45) to the refractive index of a silicon nitride film (2.0), as viewed in the direction of light incident on the film-stack. The etch-rate also varies. Both the refractive index and the etch-rate can vary continuously or step-wise. In a continuous-variation construct, described in connection with FIGS. 9A, 9B below, multiple reflection is decreased to improve light receiving sensitivity, as compared with the step-wise case in which the film-stack is essentially only two layers—a single layer of silicon nitride and a single layer of silicon oxide, as discussed below in connection with FIGS. 6A, 6B.

After the graded film-stack 36 is deposited, a resist layer 38 is formed over the graded-index film-stack 36 and patterned. Etching takes place through patterned openings in the resist layer 38. High-oxide microlens material exhibits a higher etch rate than the low-oxide material, as represented by the horizontal arrows in FIG. 3. Consequently, as etching proceeds microlenses 44 having a refractive-index gradient are formed as shown in FIG. 4. The resist layer 38 is removed to obtain the microlenses 44 as shown in FIG. 5.

The following chart illustrates etch chemistry and oxide and nitride-etch rates for two film-stack materials representative of etch-rates and the graded film-stacks of an exemplary embodiment of the present invention:

| Film-Stack | AA:HF 100:1 | AA:HF 30:1 | APM/SC1 100:3:2_55 | APM/SC1 20:4:1_65 | BOE 20:1 | HF | HF 10:1 |
|---|---|---|---|---|---|---|---|
| TEOS PECVD | 19.1 | 49.3 | | 2 | 540 | >37000 | 632 |
| Si3N4 | 7.9 | 23.4 | | 1 | 59 | 1655 | 159 |

In the chart, the various etchants can be identified as follows: AA:HF100:1 represents 100 parts Acetic Acid:1 part Hydrofluoric Acid (by wt %). AA:HF 30:1 represents 30 parts Acetic Acid:1 part Hydrofluoric Acid (by wt %). APM/SC1 100:3:2_55 represents APM=Ammonium Hydroxide/Hydrogen Peroxide Mixture; SC1=Standard Clean 1 (same as APM); 100:3:2_55=100 parts DIW:3 parts H2O2:2 parts NH4OH at 55° C. (by wt %). APM/SC1 20:4:1_65 represents APM=Ammonium Hydroxide/Hydrogen Peroxide Mixture; SC1=Standard Clean 1 (same as APM); 20:4:1_55=20 parts DIW:4 parts H2O2:1 parts NH4OH at 65° C. (by wt %). BOE 20:1 represents BOE (Buffered Oxide Etchant) ~49 wt % of 20 parts ammonium fluoride:1 part HF, the make up is DIW (by wt %). HF is pure HF. HF10:1-Hydrofluoric Acid-10 parts DIW:1 part HF (by Wt %)

Figures 6A, 6B:
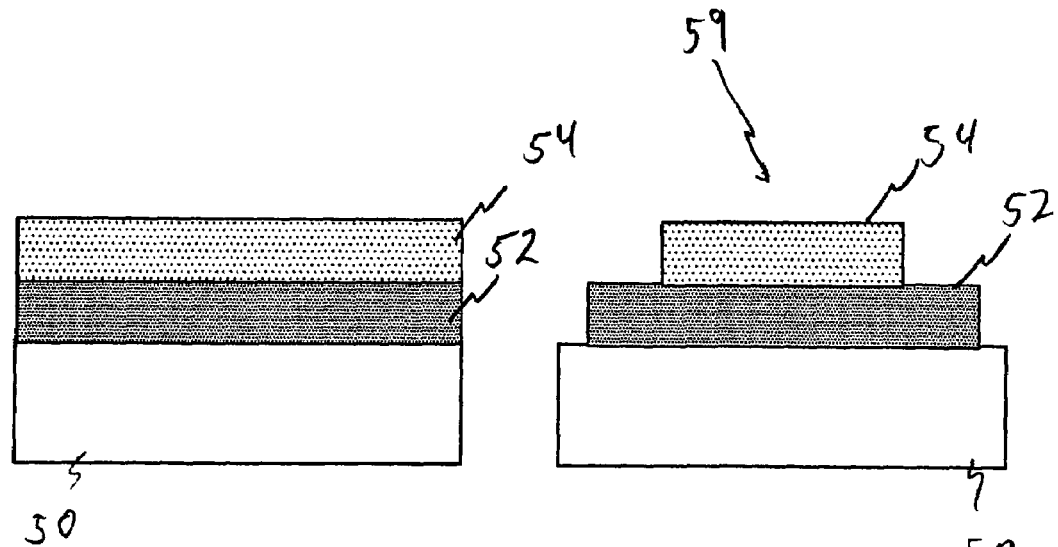
FIG. 6A illustrates initial steps in the fabrication of microlenses having a refractive-index gradient according to another exemplary embodiment of the present invention.
FIG. 6B illustrates additional steps subsequent to those shown in FIG. 6A in the fabrication of microlenses having a refractive-index gradient.

Referring to FIGS. 6A, 6B, 7A, 7B, 8A, 8B the present invention is exemplified by various alternative methods of microlens fabrication in which film-stacks having discrete layers represented as SiOxNy are utilized. FIGS. 6A, 6B feature an imager component layer 50 supporting two CVD layers 52, 54, each layer being. Uppermost glass layer 54 is a high-oxide, high etch-rate layer as compared to layer 52, which has a lower oxide concentration. FIG. 6B illustrates schematically the resulting microlens structure after patterning and wet-etching the layered film-stack of FIG. 6B and removal of the patterned resist. After etching, less remains of glass layer 50, which etches more rapidly than layer 52. Layer 52 has been etched away less than layer 50. The etched layers 50, 52 approximate the shape of a lens. The index of refraction for layer 50 is closer to that of ambient. Consequently, light received through layer 50 will transmit more-readily into the microlens structure than had it encountered only layer 52, which is made of material having a higher index of refraction than layer 50. The etch-rate and index of refraction are adjusted in the two layers by regulating the amount of oxide and nitride deposited in each layer, as described above. A photoactive structure, such as a photodiode, and associated circuitry developed in substrate 50 combine with the microlens structure to form an imager pixel 59.

Figures 7A, 7B:
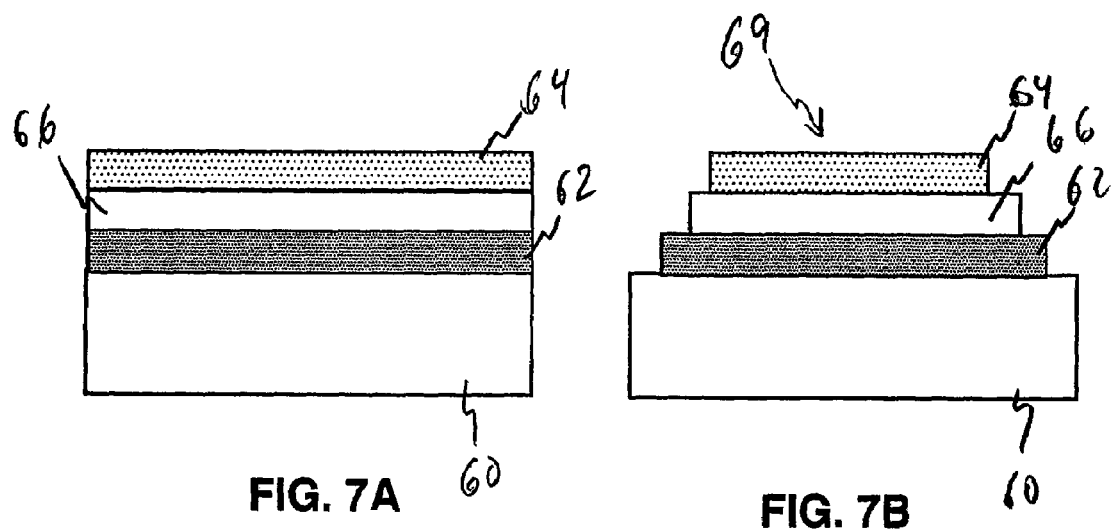
FIG. 7A illustrates initial steps in the fabrication of microlenses having a refractive-index gradient according to an additional exemplary embodiment of the present invention.
FIG. 7B illustrates additional steps subsequent to those shown in FIG. 7A in the fabrication of microlenses having a refractive-index gradient.

Referring next to FIGS. 7A and 7B, a microlens fabrication is shown in which a substrate 60 supports a film-stack featuring three layers 62, 64, 66. Layers 62, 64 may be of similar composition as layers 52, 54 of FIGS. 6A and 6B, for example. An intermediate layer 66 has etch-rate and index-of-refraction values between those provided by layers 62, 64. In the etched microlens structure illustrated in FIG. 7B, light passing from lens layer 64 to lens layer 62 passes through intermediate layer 66. The refractive index of layer 66 is intermediate those of layers 62, 64, and so lowers the relative difference in the refractive indices at each interface between layer 62, 66, and layers 66, 64. Consequently, reflective light-loss is reduced as compared to the microlens structure of pixel 59 shown in FIG. 6B. A photoactive structure, such as a photodiode, and associated circuitry developed in substrate 50 combine with the microlens structure to form an imager pixel 69.

Figure 8A:
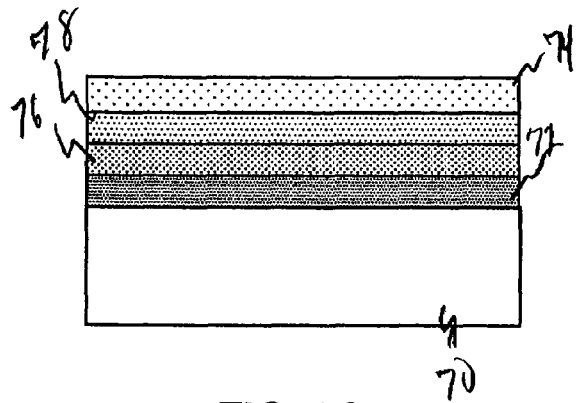
FIG. 8A illustrates initial steps in the fabrication of microlenses having a refractive-index gradient according to a further exemplary embodiment of the present invention.
Figure 8B:
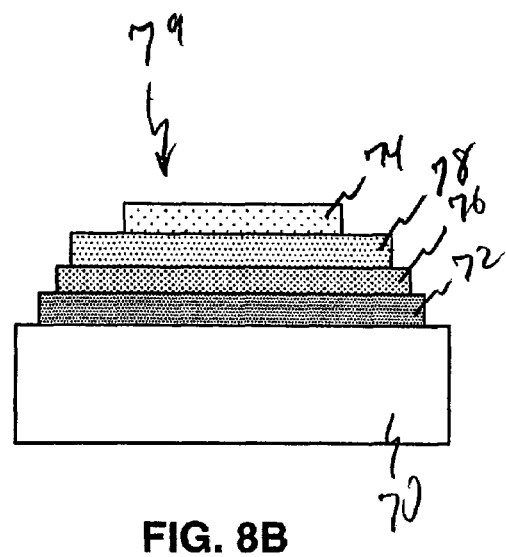
FIG. 8B illustrates additional steps subsequent to those shown in FIG. 8A in the fabrication of microlenses having a refractive-index gradient.

A further-refined microlens fabrication is illustrated in FIGS. 8A and 8B. A substrate 70 supports a film-stack featuring four deposited microlens layers 72, 74, 76, 78, as shown in FIG. 8A. The film-stack has been patterned and etched to form a microlens structure of a pixel 79 as shown in FIG. 8B. The two intermediate layers 76, 78 have etch-rates and indices of refraction between those of slow-etch layer 72 and high-etch layer 74. The etch-rate of layer 76 is slower than that of layer 78. The microlens structure of pixel 79 features a more-gradual change in the refractive indices from layer to layer than was provided in microlens structures of pixels 59, 69. The microlens structure of pixel 79 also more-closely approximates a lens in profile.

Figure 9A:
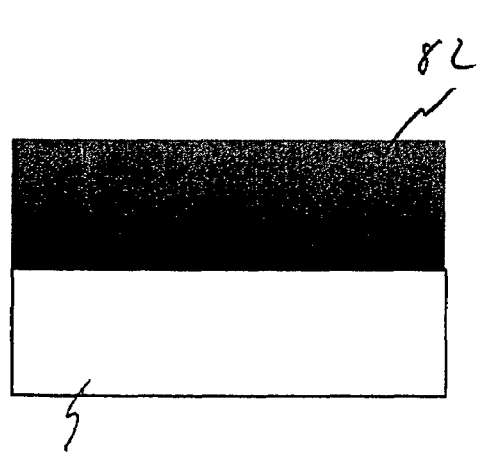
FIG. 9A illustrates initial steps in the fabrication of microlenses having a continuous refractive-index gradient according to an exemplary embodiment of the present invention.
Figure 9B:
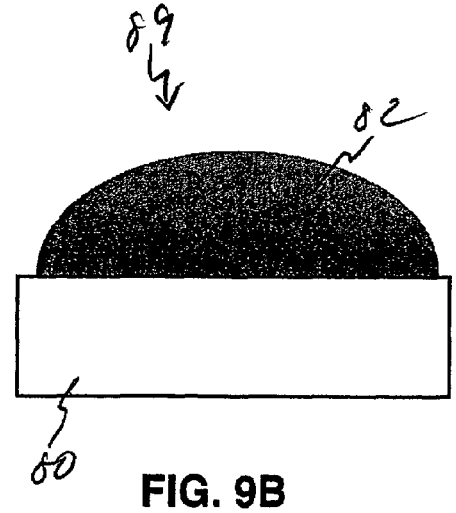
FIG. 9B illustrates additional steps subsequent to those shown in FIG. 9A in the fabrication of microlenses having a refractive-index gradient.

FIGS. 9A and 9B illustrate a microlens fabrication for a continuously-graded microlens of a pixel 89. FIG. 9A shows substrate 80 supporting continuously-graded microlens film-stack 82. The film-stack 82 is deposited using CVD techniques in which the material composition is set to provide a slow-etch, high refractive-index deposition at the outset on substrate 80. As deposition continues, the material composition is regulated to have increasingly-faster etch-rates and higher refractive indices. Rather than having distinct layers, the film-stack 82 features a continuous gradation of properties. Patterning and etching takes place as described above. The resulting microlens 89 has a smooth lenticular profile. The exemplary microlens of the pixel 89 can be formed as one of an array or matrix of microlenses, for example, associated with an array of photo-imaging devices.

Figure 10:
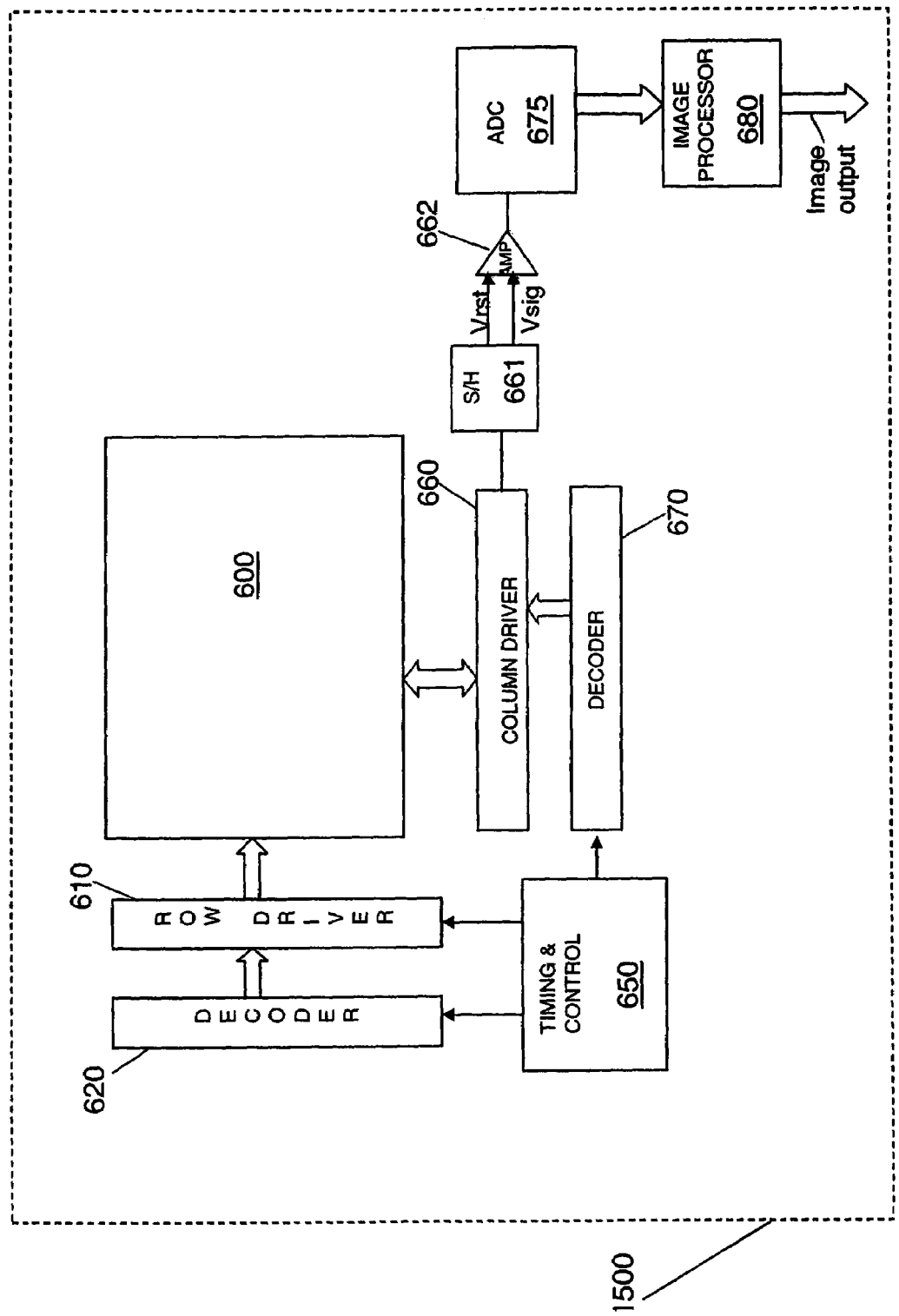
FIG. 10 is a block diagram of an imaging device featuring microlenses fabricated according to an exemplary embodiment of the present invention.

FIG. 10 illustrates a CMOS imager incorporating an imaging device array 500 having pixel cells using a lens structure in accordance with the invention to focus light onto the pixel cells. The pixel cells of each row in the imaging device array 600 are all turned on at the same time by a row select line, and the pixel cells of each column are selectively output by respective column select lines. A plurality of row and column lines is provided for the entire array 600. The row lines are selectively activated in sequence by the row driver 610 in response to row address decoder 620. The column select lines are selectively activated in sequence for each row activation by the column driver 660 in response to column address decoder 670. Thus, a row and column address is provided for each pixel cell. The CMOS imager is operated by the control circuit 650, which controls address row address decoder 620 and column address decoder 670 for selecting the appropriate row and column lines for pixel readout, and row driver 610 and column driver 660, which apply driving voltage to the drive transistors of the selected row and column lines.

The pixel output signals typically include a pixel reset signal Vrst taken off of a floating diffusion region (via the source follower transistor) when it is reset and a pixel image signal Vsig, which is taken off the floating diffusion region (via the source follower transistor) after charges generated by an image are transferred to it. The Vrst and Vsig signals are read by a sample and hold circuit 661 and are subtracted by a differential amplifier 662, which produces a difference signal (Vrst–Vsig) for each pixel cell, which represents the amount of incident light. This difference signal is digitized by an analog to digital converter 675. The digitized pixel signals are then fed to an image processor 680 to form and output a digital image.

FIG. 11 shows a system 900, a typical processor system modified to include an imager device (such as the CMOS imager device 500 illustrated in FIG. 10) of the invention. The processor system 900 is exemplary of a system having digital circuits that could include image sensor devices. Without being limiting of the invention, such a system could include a computer system, camera system, scanner, machine vision, vehicle navigation, video phone, surveillance system, auto focus system, star tracker system, motion detection system, image stabilization system, and other systems employing an imager, other light-collecting applications, and light-projection or display applications.

System 900, for example a camera system, generally comprises a central processing unit (CPU) 902, such as a microprocessor, that communicates with an input/output (I/O) device 906 over a bus 904. CMOS imager device 500 also communicates with the CPU 902 over the bus 904. The processor-based system 900 also includes random access memory (RAM) 910, and can include removable memory 914, such as flash memory, which also communicate with the CPU 902 over the bus 904. The CMOS imager device 608 may be combined with a processor, such as a CPU, digital signal processor, or microprocessor, with or without memory storage on a single integrated circuit or on a different chip than the processor.

Exemplary embodiments of the invention have been described with specific references to pixels, photodiodes, and imaging devices. The invention has broader applicability and may be used in any imaging apparatus. For example, the invention may be used in conjunction with any solid-state imager, for example, charge coupled device (CCD) imagers, solar panels, and display devices. In general, the invention has applicability to image-formation devices using microlenses. More generally, the invention provides structure and fabrication methods in which a microlens has a graded index of refraction. Although convex microlenses have been illustrated and described, those of skill in the art will appreciate that other microlens configurations, such as concave microlenses, also could be fabricated by applying the disclosed teachings.

The processes and devices described above illustrate exemplary methods and devices out of many that could be used and produced according to the present invention. The above description and drawings illustrate exemplary embodiments which achieve the objects, features, and advantages of the present invention. It is not intended, however, that the present invention be strictly limited to the above-described and illustrated embodiments. Any modification, even if presently unforeseeable, of the present invention that comes within the spirit and scope of the following claims should be considered part of the present invention.

What is claimed as new and desired to be protected by Letters Patent of the United States is:

1. A method of forming a microlens comprising steps of:
   forming a lens-material including oxygen and nitrogen and having an etch-rate gradient;
   layering the lens-material on a substrate to form a film-stack having a bottom and a top, each layer of lens material having a different index of refraction, the index of refraction being higher at the bottom of the film stack than at the top;
   coating and patterning a resist on the film-stack;
   selectively etching the film-stack material through openings in the resist; and
   removing the resist, the film-stack material being etched into a microlens that is only convex.

2. A method as in claim 1, wherein the etch-rate gradient is obtained by adjusting the oxygen content and the nitrogen content of the lens-material during deposition of the lens-material.

3. A method as in claim 1, wherein the etch-rate gradient is formed such that lens-material has a progressively higher etch-rate nearer the resist.

4. A method as in claim 3, wherein the oxygen:nitrogen content ratio is relatively higher toward the top of the lens material than toward the bottom of the lens material.

5. A method of fabricating a microlens comprising steps of:
   layering material on a substrate to form a film-stack having a bottom and a top defining a thickness, the film-stack having a gradient;
   patterning a resist layer formed on the film-stack; and
   removing the material from the film-stack selectively through openings in the resist layer such that relatively more of the material is removed at respectively thicker portions of the film-stack, such that remaining material forms a microlens that is only convex with an index of refraction that is higher at the bottom than at the top.

6. A method as in claim 5, wherein the step of removing comprises etching using a wet etch.

7. A method as in claim 5, wherein the material has an oxygen:nitrogen content ratio that varies during deposition of the material.

8. A method as in claim 7, wherein an oxygen:nitrogen content ratio of the deposited material is varied continuously during deposition.

9. A method as in claim 7 wherein the oxygen:nitrogen content ratio of the deposited material is varied in discrete steps during deposition.

* * * * *